United States Patent
Zeitner et al.

(10) Patent No.: US 10,101,665 B2
(45) Date of Patent: Oct. 16, 2018

(54) ILLUMINATION UNIT AND DEVICE FOR LITHOGRAPHIC EXPOSURE

(71) Applicants: Fraunhofer-Gesellschaft zur Förderung der angewandten Forschung e.V., Munich (DE); Friedrich-Schiller-Universität Jena, Jena (DE)

(72) Inventors: Uwe Detlef Zeitner, Weimar (DE); Tina Weichelt, Jena (DE); Yannick Bourgin, Jena (DE)

(73) Assignees: Fraunhofer-Gesellschaft zur Förderung der angewandten Forschung e.V., München (DE); Friedrich-Schiller-Universität Jena, Jena (DE)

( * ) Notice: Subject to any disclaimer, the term of this patent is extended or adjusted under 35 U.S.C. 154(b) by 0 days.

(21) Appl. No.: 15/258,734

(22) Filed: Sep. 7, 2016

(65) Prior Publication Data
US 2017/0068168 A1    Mar. 9, 2017

(30) Foreign Application Priority Data
Sep. 8, 2015  (DE) .................. 10 2015 115 064

(51) Int. Cl.
| | |
|---|---|
| *G03B 27/72* | (2006.01) |
| *G03F 7/20* | (2006.01) |
| *G02B 26/10* | (2006.01) |
| *G02B 26/08* | (2006.01) |
| *G02B 27/09* | (2006.01) |

(52) U.S. Cl.
CPC ..... *G03F 7/70075* (2013.01); *G02B 26/0833* (2013.01); *G02B 26/10* (2013.01); *G02B 26/101* (2013.01); *G02B 26/105* (2013.01); *G02B 27/0944* (2013.01); *G02B 27/0955* (2013.01);
(Continued)

(58) Field of Classification Search
CPC .............. G02B 26/0833; G02B 26/101; G02B 26/105; G02B 27/0944; G02B 27/0955; G02B 26/10; G03F 7/70075; G03F 7/70158; G03F 7/70583
See application file for complete search history.

(56) References Cited

U.S. PATENT DOCUMENTS

| | | |
|---|---|---|
| 4,497,015 A | 1/1985 | Konno et al. |
| 5,307,207 A | 4/1994 | Ichihara |

(Continued)

FOREIGN PATENT DOCUMENTS

EP    2253997 A2    11/2010

OTHER PUBLICATIONS

Bourgin, Y. et al., "Double-sided structured mask for sub-micron resolution proximity i-line mask-aligner lithography," Optics Express, vol. 23, No. 13, Jun. 29, 2015, pp. 16628-16637.

(Continued)

*Primary Examiner* — Deoram Persaud
(74) *Attorney, Agent, or Firm* — Slater Matsil, LLP

(57) ABSTRACT

An illumination unit for lithographic exposure and a device for lithographic exposure are disclosed. In an embodiment the illumination unit includes a beam source, an electronically drivable beam deflection element for generating a temporally varying two-dimensional beam deflection, a collimation lens, a beam homogenizing element, a Fourier lens and a field lens.

9 Claims, 1 Drawing Sheet

(52) U.S. Cl.
CPC ...... *G03F 7/70158* (2013.01); *G03F 7/70583* (2013.01)

(56) References Cited

U.S. PATENT DOCUMENTS

| | | | | |
|---|---|---|---|---|
| 5,453,814 A * | 9/1995 | Aiyer | ............... | G03F 7/70208 355/53 |
| 6,587,182 B1 * | 7/2003 | Goto | ............... | G03F 7/70583 355/53 |
| 8,172,404 B2 * | 5/2012 | Silverstein | ............ | G03B 21/208 349/5 |
| 8,508,716 B2 * | 8/2013 | Claessens | ............ | G02B 27/0905 355/67 |
| 9,039,188 B2 * | 5/2015 | Takanokura | ............ | G03B 21/14 353/31 |
| 9,280,060 B2 * | 3/2016 | Scholz | ............... | G03F 7/70075 |
| 2007/0279535 A1 * | 12/2007 | Fiolka | ............... | G03F 7/70075 348/744 |
| 2008/0013182 A1 * | 1/2008 | Ferber | ............... | B23K 26/0648 359/619 |
| 2008/0151206 A1 | 6/2008 | Baselmans et al. | | |
| 2008/0247022 A1 * | 10/2008 | Yamauchi | ............... | G02B 27/48 359/211.1 |
| 2009/0032511 A1 * | 2/2009 | Adams | ............... | B23K 26/0613 219/121.75 |
| 2009/0068802 A1 * | 3/2009 | Moriwaka | ............ | B23K 26/0648 438/166 |
| 2009/0231718 A1 * | 9/2009 | Muenz | ............... | B23K 26/0604 359/626 |
| 2010/0053565 A1 * | 3/2010 | Mizushima | ............ | G02B 3/0006 353/38 |
| 2010/0165427 A1 * | 7/2010 | Tanioka | ............ | G11B 7/00772 359/6 |
| 2011/0228247 A1 * | 9/2011 | Mulder | ............... | G03F 7/70116 355/71 |
| 2012/0044553 A1 * | 2/2012 | Kurashige | ............... | G02B 5/32 359/15 |
| 2012/0081786 A1 * | 4/2012 | Mizuyama | ............ | G02B 27/286 359/492.01 |
| 2012/0127848 A1 * | 5/2012 | Saito | ............... | G11B 7/268 369/284 |
| 2013/0250269 A1 | 9/2013 | Ishida et al. | | |
| 2016/0011426 A1 * | 1/2016 | Mitra | ............... | G02B 27/0927 359/623 |
| 2016/0042757 A1 * | 2/2016 | Onoe | ............... | G11B 7/083 720/695 |
| 2017/0102551 A1 * | 4/2017 | Deguenther | ............ | G02B 6/0096 |

OTHER PUBLICATIONS

Partel, S. et al., "Contact and proximity lithography using 193 nm Excimer laser in Mask Aligner," The 35th International Conference on Micro- and Nano-Engineering (MNE), Microelectronic Engineering, vol. 87, Issue 5-8, May-Aug. 2010, pp. 936-939.
"SCANcube datasheet," SCANLAB AG, Dec. 2014, 4 pages.
Voelkel, R. et al., "Advanced mask aligner lithography: new illumination system," Optics Express, vol. 18, No. 20, Sep. 27, 2010, pp. 20968-20978.
Vveichelt, T. et al., "Resolution enhancement for advanced mask aligner lithography using phase-shifting photomasks," Optics Express, vol. 22, No. 13, Jun. 30, 2014, pp. 16310-16321.

* cited by examiner

ILLUMINATION UNIT AND DEVICE FOR LITHOGRAPHIC EXPOSURE

CROSS-REFERENCE TO RELATED APPLICATIONS

This application claims priority to German Patent Application No. 10 2015 115 064.6, filed on Sep. 8, 2015, which application is hereby incorporated herein by reference.

TECHNICAL FIELD

The invention relates to an illumination unit for lithographic exposure and a device for lithographic exposure comprising such an illumination unit.

BACKGROUND

Lithographic methods are often used for producing deterministic microstructures. In this case, a radiation-sensitive polymer layer (resist) is exposed with a laterally varying dose distribution of a specific type of radiation. The introduced radiation dose alters the polymer properties in such a way that, in a subsequent development step, selectively only the irradiated (positive resist) or only the unirradiated (negative resist) regions of the polymer layer are dissolved and thus removed.

Lithography systems used in microelectronics and microsystems engineering often use a so-called mask aligner (mask positioner) that is a device for exactly positioning photomasks. In this case, the light from a beam source having the shortest possible wavelength, for example, from a high-pressure mercury lamp, is collected with the aid of an illumination unit and used for illuminating a prefabricated photomask. Said photomask contains the structures to be exposed into the radiation-sensitive polymer layer in the form of transparent and non-transparent regions which are introduced e.g. into a thin chromium layer on a mask substrate. In the transparent regions, the chromium layer is selectively removed for this purpose. With such a photomask, the illumination light is correspondingly modulated upon passing through the photomask. The polymer layer to be exposed is situated on a substrate that is brought into direct contact with the photomask (so-called contact printing), or is situated at a small distance of a few micrometers from the photomask (so-called proximity printing).

In recent years, specific mask aligner based lithography methods have been developed in which the structure is no longer copied from the mask into the photoresist by simple shadow casting, rather diffraction effects at specifically calculated photomask structures are used in a targeted manner for resolution enhancement in the exposure of the photoresist. Such a method is known, for example, from the document T. Weichelt, U. Vogler, L. Stuerzenbecher, R. Voelkel, U. D. Zeitner, "Resolution enhancement for advanced mask aligner lithography using phase-shifting photomasks", Optics Express 22 (2014), 16310-16321. Such a method is also referred to as diffraction lithography.

Conventional illumination using high-pressure Hg lamps is encountering limits particularly in diffraction lithography. The diffraction-lithographic methods typically require mask illumination with very low residual divergence of the illumination angles. In conventional illumination this can be realized only by means of an aperture stop having a very small opening in the illumination beam path. As a result of the small stop opening, however, the available light power decreases to such a great extent that impracticably long exposure times are the consequence. On account of the properties of high-pressure mercury lamps (thermal beam source having a source volume in the range of mm$^3$) this problem is virtually insurmountable.

Alternatively, a laser can be used as beam source, a significantly higher degree of collimation of the illumination being achievable with said laser. However, the high coherence of lasers in a conventional illumination beam path of the mask aligner leads to the occurrence of spatially high-frequency interference patterns (so-called speckles) which significantly impair the homogeneity of the mask illumination locally and lead to unusable exposure results.

SUMMARY

Embodiments of the invention provide an illumination unit and a device for lithographic exposure which overcome the disadvantages mentioned above and enable a homogeneous mask illumination with a defined illumination angle distribution that is settable in a targeted manner.

In accordance with at least one configuration, the illumination unit for lithographic exposure comprises a beam source, wherein the beam source is a laser light source, an electronically drivable beam deflection element suitable for two-dimensional beam deflection, a collimation lens, a beam homogenizing element, a Fourier lens and a field lens, which is provided for the telecentric illumination of a photomask. The elements specified are arranged in the stated order in the beam path of the illumination unit. This does not rule out the fact that one or more further elements can be arranged between the elements mentioned. By way of example, a polarizing optical element can be arranged between the beam source and the beam deflection element.

In the case of the illumination unit, the two-dimensional beam deflection element is used to produce advantageously a defined angle distribution in the directions perpendicular to the optical axis, for example, in an x-direction and a y-direction, which are orthogonal to one another and in each case run perpendicular to the optical axis. In particular, in this way the light from the beam source is directed with an angle distribution set in a targeted manner onto the collimation lens situated downstream of the beam deflection element. By way of example, with the beam deflection element it is possible to produce an angle distribution of in each case up to ±20° in the x- and y-directions.

The collimation lens situated downstream of the beam deflection element in the beam path collimates the incident radiation with the defined angle distribution, i.e. deflects it in such a way that it propagates parallel to the optical axis. The collimated radiation subsequently impinges on a beam homogenizing element, which produces a defined angle distribution and advantageously homogenizes the radiation. The beam homogenizing element acts as a diffusor in particular. In the case of a laser light source, the beam homogenizing element can homogenize in particular a spatially high-frequency interference pattern of the laser light source. The beam homogenizing element can produce, for example, an angle distribution of approximately ±9° in the x- and y-directions.

From the radiation with a defined angle distribution that is generated by means of the beam homogenizing element, a lens system comprising a Fourier lens and a field lens is used to produce a spatial intensity distribution in the plane of the field lens. The field lens has the function of illuminating a photomask telecentrically in a lithographic device.

A photomask is advantageously fully illuminated by means of the lens system comprising the Fourier lens and the field lens.

The beam deflection element is advantageously an electronically drivable beam deflection element which produces a temporally varying beam deflection in two spatial directions. The temporally varying beam deflection projects the beam of the beam source in this way onto a surface, in particular onto the collimation lens downstream of the beam source. The beam deflection element is, in particular, a scanning beam deflection element which, by means of the temporally varying beam deflection, illuminates a surface that is large in comparison with the beam diameter of the beam source.

The beam deflection element for two-dimensional beam deflection may be a 2D mirror scanner, i.e. a mirror scanner which can bring about a beam deflection in two axes. Such mirror scanners are known per se and are used in projection devices, for example. The mirror scanner can comprise, for example, two mirrors that are rotatable by a drive, wherein one mirror brings about a beam deflection in the x-direction and a second mirror brings about a beam deflection in the y-direction, wherein the x-direction and the y-direction are perpendicular to one another and in particular in each case run perpendicular to the optical axis.

Preferably, the 2D mirror scanner is a galvanometer scanner, or galvoscanner for short. In the case of the galvanometer scanner, the two mirrors are advantageously moved by a galvanic drive. A galvanometer scanner is distinguished by the fact that the mirrors can be moved at very high speed. By way of example, the mirrors can be moved at a positioning speed of up to 15 m/s. As an alternative to a galvanometer scanner, some other 2D mirror scanner can also be used, for example, a MEMS mirror scanner (Micro-Electro-Mechanical System).

In accordance with one configuration, the beam deflection element has an electronic control unit, by which in particular the angle distribution of the beam deflection is settable. By way of example, the beam deflection element can have a computer controller. The controller of the beam deflection element can be integrated, for example, into a computer controller of the illumination device and/or of the entire lithographic device.

The beam homogenizing element may comprise a diffractive structure for producing a defined angle distribution of the radiation. In accordance with at least one configuration, the beam homogenizing element is a diffractive optical element (DOE). The diffractive optical element can have, for example, at least one computer generated hologram (CGH). Furthermore, the beam homogenizing element can be a refractive-diffractive optical element, that is to say a hybrid element having simultaneously diffractive properties and interfaces that act in a refractive fashion.

In accordance with one advantageous configuration, the beam homogenizing element is moveable. In particular, the beam homogenizing element can have an electronic driving assembly designed to move the beam homogenizing element during the operation of the illumination unit. The electronic driving assembly can be a computer controller, which can be integrated in particular into a computer controller of the illumination unit and/or of the lithographic device. The beam homogenizing element can be designed in particular to perform a rotational movement about at least one axis and/or a translational movement in at least one direction during the operation of the illumination unit.

In particular, it can be provided that the beam homogenizing element is rotatable about a rotation axis which does not run collinearly with respect to the optical axis of the illumination device, rather the rotation axis is tilted and/or displaced in a parallel fashion with respect to the optical axis. In other words, the beam homogenizing element is rotatable eccentrically.

What is advantageously achieved by means of the translational and/or rotational movement of the beam homogenizing element during the operation of the illumination unit is that in a temporally varying manner different regions of the beam homogenizing element, in particular of the diffractive structure of the beam homogenizing element are moved into the illumination beam. In this way it becomes possible to minimize in particular spatially high-frequency interference patterns that can arise as a result of a coherent illumination by means of a laser light source, and thus to homogenize the illumination beam. In this way, a particularly homogeneous angle distribution is advantageously obtained downstream of the beam homogenizing element, which angle distribution is transferred into a homogeneous intensity and angle distribution in the illumination plane of a photomask by means of the downstream lens system comprising the Fourier lens and the field lens.

In one configuration, the beam homogenizing element has a multiplicity of diffractive optical elements such as holograms, for example, which may be arranged alongside one another in a 2-dimensional arrangement. The movement of the beam homogenizing element advantageously enables different diffractive elements to be rotated through the illumination beam. A homogenization of the illumination light can thus be obtained by means of a continuous movement of the beam homogenizing element during an exposure process. It is advantageously also possible to produce a desired angle distribution of the illumination light by targeted illumination of specific regions of the beam homogenizing element.

The beam source of the illumination unit may comprise a laser light source. A laser light source has the advantage in particular, that a polarized illumination can be effected, without light power being lost at a polarizer. By way of example, an excimer laser such as, for example, an ArF laser or KrF laser or a solid-state laser such as an Nd:YAG laser, for example, can be used as beam source. Alternatively it is also conceivable to use a laser diode, an LED or a super continuum source as beam source. The laser light source can be operated with a frequency conversion, in particular a frequency doubling or frequency tripling. This is advantageous particularly in the case of a solid-state laser such as an Nd:YAG laser, for example, in order to convert a comparatively long output wavelength of e.g. 1064 nm into a shorter wavelength of 532 nm or 335 nm. The use of short wavelengths is advantageous in lithography for obtaining a high resolution.

In a further configuration, a polarizing optical element is arranged between the beam source and the beam deflection element. This is advantageous particularly if the beam source itself is not polarized. The polarizing optical element can be, for example, a wire grid polarizer, a $\lambda/2$ plate, a $\lambda/4$ plate, a Pockels cell or a diffractive optical element.

Furthermore, a lithographic device is specified, which comprises the illumination unit described above and a photomask. The beam homogenizing element of the illumination source, for producing a homogeneous angle distribution of the illumination light impinging on the photomask, is arranged advantageously in the Fourier plane of the photomask.

The photomask has, in particular, a mask structure that is imaged into a radiation-sensitive polymer layer (resist) by means of the illumination light generated. The radiation-sensitive polymer layer can be arranged, for example, on a substrate positioned in the beam path downstream of the photomask.

Further advantageous configurations of the lithographic device will become apparent from the description of the illumination source.

BRIEF DESCRIPTION OF THE DRAWINGS

The invention is explained in greater detail below on the basis of an exemplary embodiment in association with FIGS. 1 and 2.

In the figures.

The component parts illustrated in the figures and the size relationships of the component parts among one another should not be regarded as true to scale.

DETAILED DESCRIPTION OF ILLUSTRATIVE EMBODIMENTS

Figure 1:
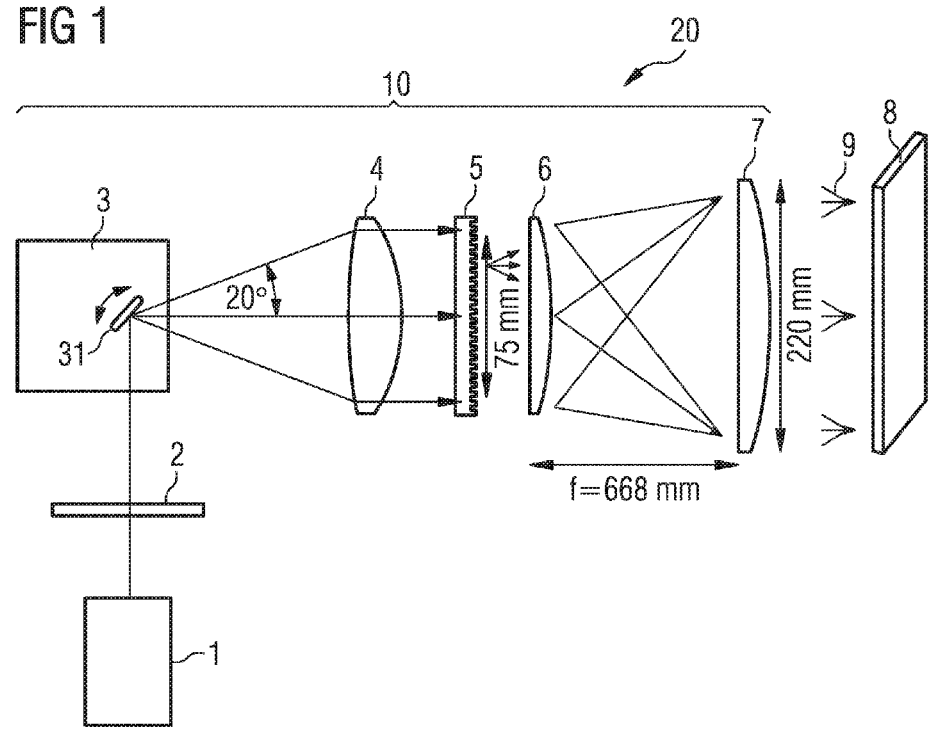
FIG. 1 shows a schematic illustration of a device for lithographic exposure comprising an illumination unit in accordance with one exemplary embodiment.

The device for lithographic exposure 20 illustrated in FIG. 1 contains an illumination device 10 provided for illuminating a photomask 8 with an illumination light 9.

The illumination unit 10 comprises a beam source 1 which is preferably a laser light source. In the exemplary embodiment, for example, an Nd:YVO$_4$ solid-state laser having a wavelength $\lambda$=355 nm generated by frequency tripling is used. The beam source 1 can have, for example, a power of approximately 1.5 W to 4 W and a beam diameter of approximately 1 mm.

With the use of a laser light source as beam source 1, advantageously polarized illumination light 9 is emitted, without light intensity being lost at a polarizer.

Alternatively, an unpolarized beam source 1 can also be used. It is possible for a polarizing optical element 2 to be arranged in the beam path, said polarizing optical element polarizing the radiation emitted by the beam source 1 or changing the polarization state. The polarizing optical element 2 can be, for example, a wire grid polarizer, a $\lambda/2$ plate, a $\lambda/4$ plate, a Pockels cell or a diffractive optical element.

A beam deflection element 3 is situated downstream of the beam source 1 in the beam path. The beam deflection element 3 may comprise a 2D mirror scanner containing two moveable mirrors, which advantageously enable a beam deflection in two mutually perpendicular axes. In the side view illustrated in FIG. 1, only one of the two mirrors 31 is visible, which brings about a beam deflection in the y-direction, for example. A further mirror not visible in FIG. 1 brings about an additional beam deflection in an x-direction, which is perpendicular to the plane of the drawing. The 2D mirror scanner can be a galvanometer scanner, for example, in which the mirrors 31 are driven galvanically. The beam deflection element 3 can enable, for example, a maximum beam deflection of in each case ±20° in the x-direction and the y-direction.

The beam deflection element 3 may be electronically drivable, in particular by means of a computer controller. The electronically drivable beam deflection element 3 makes it possible, in particular, to scan the beam of the beam source 1 by means of a fast temporal variation of the beam deflection over a surface to be illuminated, and in this way to illuminate the surface. The computer controller of the beam deflection advantageously makes it possible to arbitrarily define the shape of the illuminated surface, wherein the boundaries are substantially only predefined by the maximum possible beam deflection in the x-direction and y-direction. The illuminated surface over which the beam is scanned by means of the beam deflection element 3 can have a circular or rectangular shape, for example. Alternatively, any other geometrical shapes or patterns are also possible, in particular characters, letters or numbers.

A collimation lens 4 is situated downstream of the beam deflection element 3 in the beam path, wherein the light entrance surface of the collimation lens 4 is illuminated by the temporally variable beam deflection. The incident divergent radiation is collimated, i.e. directed parallel, by the collimation lens 4. In order to obtain a good collimation in particular also in the edge regions of the collimation lens 4, an aspherical collimation lens 4 may be provided. By way of example, the light entrance surface of the collimation lens 4 facing the beam deflection element 3 is embodied in a cylindrical fashion and the opposite light exit surface is embodied in an aspherical fashion.

A beam homogenizing element 5 is arranged downstream of the collimation lens 4 in the beam path, the light collimated by the collimation lens 4 preferably impinging on said beam homogenizing element perpendicularly. The beam homogenizing element 5 can have, for example, a diameter of approximately 75 mm. The beam homogenizing element 5 is advantageously not a static optical element, but rather drivable such as an electrically drivable moveable element. The beam homogenizing element 5 may move continuously during the operation of the lithographic device, in particular during an exposure process. The movement of the beam homogenizing element 5 may be a rotational movement about at least one rotation axis that is not identical to the optical axis of the illumination unit. Moreover the rotation axis of the beam homogenizing element 5 is tilted and/or displaced in a parallel fashion relative to the optical axis. It can also be provided that the rotation axis of the beam homogenizing element 5 is not stationary, but rather varies over time. The beam homogenizing element 5 can perform, for example, a superimposition of a plurality of rotational movements, which can be realized in particular by means of a planetary gear mechanism.

Additionally or alternatively, the beam homogenizing element 5 can perform a translational movement such as a translational movement in a plane running perpendicular to the optical axis such that the position of the beam homogenizing element 5 on the optical axis relative to the other optical components does not change during the movement.

What is advantageously achieved by the movement of the beam homogenizing element 5 is that during an exposure process different regions of the beam homogenizing element 5 are impinged on by the illumination beam. Undesirable interference effects such as speckles, for example, which can arise on account of a coherent beam source 1, are reduced in this way.

Figure 2:
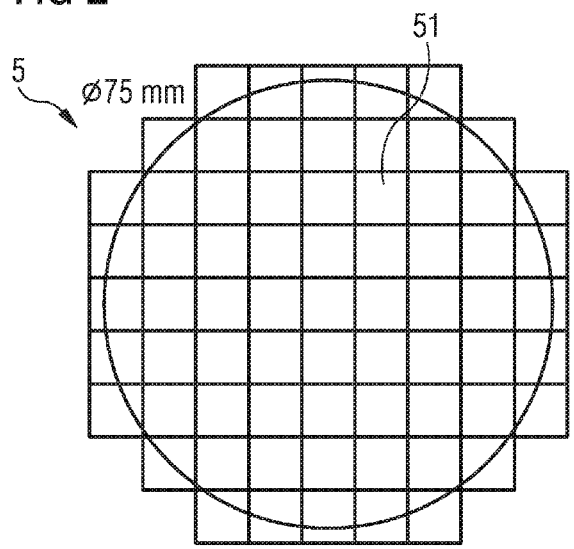
FIG. 2 shows a schematic illustration of the beam homogenizing element in the case of the exemplary embodiment.

The beam homogenizing element 5 may comprise a diffractive optical element having, for example, at least one computer generated hologram. In one configuration, the beam homogenizing element 5 has a multiplicity of diffractive optical elements 51. One example of such a beam homogenizing element 5 is illustrated in FIG. 2. The plurality of diffractive optical elements 51 can be joined together, for example, to form a two-dimensional array. The beam homogenizing element 5 has, for example, a diameter of approximately 75 mm. A multiplicity of diffractive elements 51, which are in each case computer generated holograms, for example, are arranged on the surface of the beam homogenizing element. The size of the individual diffractive elements may correspond approximately to the beam diameter of the beam source 1, for example, approximately 1 mm². The plurality of diffractive optical elements 51 may have the same function, in particular the function of producing a predefined angle distribution. However, this function is brought about by different interference patterns in the case of the different diffractive elements 51. In the exemplary embodiment illustrated, an angle distribution of ±9°, for example, is produced by the beam homogenizing element.

The beam homogenizing element 5 is followed in the beam path by a lens system consisting of a Fourier lens 6 and a field lens 7. In the exemplary embodiment, the distance between the Fourier lens 6 and the field lens 7 is approximately 668 mm. This distance in association with the angle distribution of ±9° generated by the beam homogenizing element 5 generates an illumination of 220 mm in diameter. By means of the Fourier lens 6, the homogeneous angle distribution of ±9°, for example, which is produced by the beam homogenizing element 5, is converted into a homogeneous intensity distribution in the plane of the field lens 7. The field lens 7 can have, for example, a diameter of approximately 220 mm. In order to avoid optical imaging aberrations, in particular in the edge regions, aspherical lenses may be used in each case for the Fourier lens 6 and the field lens 7. The field lens 7 advantageously brings about a telecentric illumination of the photomask 8 situated downstream in the beam path. The illumination light 9 impinging on the photomask 8 downstream of the field lens 7 has, for example, a homogeneous angle distribution of ±3°.

In one configuration, the angle distribution of the illumination light 9 which impinges on the photomask 8 is settable by means of the angle distribution produced by the beam deflection element 3. By means of a computer controller of the beam deflection element 3 a desired angle distribution of the illumination light 9 in the region of the photomask can thus be selected in a targeted manner for an exposure process.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. An illumination unit for lithographic exposure comprising:
    a beam source;
    an electronically drivable beam deflection element for generating a temporally varying two-dimensional beam deflection;
    a collimation lens;
    a beam homogenizing element comprising:
        an electronic driving assembly designed to move the beam homogenizing element during operation of the illumination unit; and
        a plurality of diffractive optical elements which are arranged alongside one another in a 2-dimensional arrangement;
    a Fourier lens; and
    a field lens,
    wherein light collimated by the collimation lens impinges perpendicularly on the beam homogenizing element, and
    wherein the field lens is designed for a telecentric illumination of a photomask.

2. The illumination unit according to claim 1, wherein the beam deflection element is a 2D mirror scanner.

3. The illumination unit according to claim 2, wherein the 2D mirror scanner is a galvano scanner or a MEMS scanner.

4. The illumination unit according to claim 1, wherein the beam deflection element has an electronic control unit by which an angle distribution of a beam deflection is settable.

5. The illumination unit according to claim 1, wherein the beam homogenizing element is designed to perform a rotational movement about at least one axis and/or a translational movement in at least one direction during operation of the illumination unit.

6. The illumination unit according to claim 1, wherein the beam source is a laser light source.

7. The illumination unit according to claim 1, further comprising a polarizing optical element arranged between the beam source and the beam deflection element.

8. A device for lithographic exposure comprising:
    an illumination unit according to claim 1; and
    a photomask.

9. The device for lithographic exposure according to claim 8, wherein the beam homogenizing element for generating a homogenous angle distribution of an illumination light impinging on the photomask is arranged in a Fourier plane of the photomask.

* * * * *